(12) United States Patent
Sakai et al.

(10) Patent No.: US 6,509,531 B2
(45) Date of Patent: Jan. 21, 2003

(54) MONOLITHIC CERAMIC ELECTRONIC COMPONENT, METHOD FOR MANUFACTURING THE SAME, AND ELECTRONIC DEVICE

(75) Inventors: Norio Sakai, Moriyama (JP); Isao Kato, Shiga-ken (JP); Kazuhiro Isebo, Takefu (JP)

(73) Assignee: Murata Manufacturing Co., Ltd, Kyoto (JP)

( * ) Notice: Subject to any disclaimer, the term of this patent is extended or adjusted under 35 U.S.C. 154(b) by 0 days.

(21) Appl. No.: 09/784,904

(22) Filed: Feb. 16, 2001

(65) Prior Publication Data

US 2001/0033474 A1 Oct. 25, 2001

(30) Foreign Application Priority Data

Mar. 17, 2000 (JP) ........................................ 2000-075487

(51) Int. Cl.[7] .................................................. H05K 1/11
(52) U.S. Cl. ........................ 174/264; 174/255; 174/260; 361/795
(58) Field of Search ................................. 174/256, 258, 174/255, 262, 263, 264, 265, 266; 361/780, 792, 793, 794, 795

(56) References Cited

U.S. PATENT DOCUMENTS

| 4,685,033 | A | * | 8/1987 | Inoue | .......................... 174/258 |
|---|---|---|---|---|---|
| 5,024,883 | A | * | 6/1991 | SinghDeo et al. | ........ 156/89.15 |
| 5,383,093 | A | * | 1/1995 | Nagasaka | .................... 174/256 |
| 6,108,212 | A | * | 8/2000 | Lach et al. | .................. 174/255 |
| 6,118,671 | A | * | 9/2000 | Tanei et al. | .................. 174/252 |
| 6,205,032 | B1 | * | 3/2001 | Shepherd | ...................... 174/255 |
| 6,248,959 | B1 | * | 6/2001 | Sylvester | ...................... 174/256 |
| 6,320,140 | B1 | * | 11/2001 | Enomoto | ..................... 174/255 |
| 6,329,065 | B1 | * | 12/2001 | Ishida et al. | ................. 174/256 |
| 6,359,234 | B1 | * | 3/2002 | Kouda | .......................... 174/255 |

* cited by examiner

*Primary Examiner*—Albert W. Paladini
*Assistant Examiner*—José H. Alcalá
(74) *Attorney, Agent, or Firm*—Keating & Bennett, LLP

(57) ABSTRACT

A monolithic electronic component includes a composite body having a plurality of stacked ceramic layers. The ceramic layers include interconnecting conductors provided in each of the ceramic layers, including first terminals, arranged on a first end surface in the stacking direction of the composite body, for defining connections with an interconnection substrate, and second terminals, arranged on a second end surface opposite of the first end surface of the composite, for defining connections with a mounted component. The first terminals are defined by conductor layers provided on the first end surface and the second terminals are defined by exposed end surfaces of terminal via-hole conductors which extend from the inner portion of the composite to the second end surface. The exposed end surfaces of the terminal via-hole conductors are flat and are on substantially the same plane as the second end surface.

11 Claims, 5 Drawing Sheets

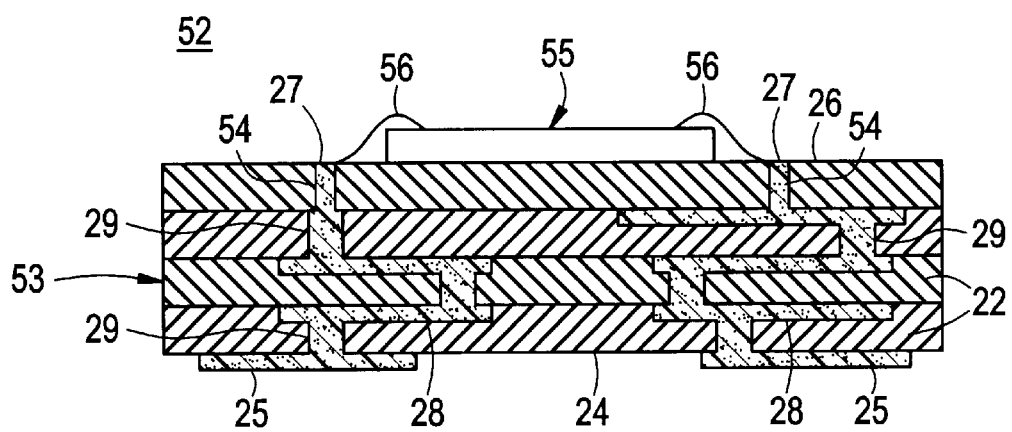
FIG. 7
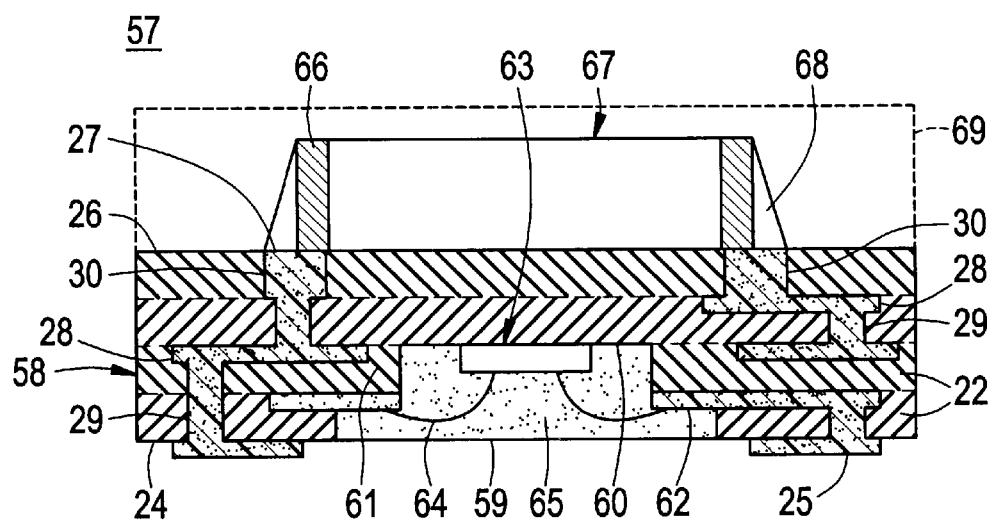
FIG. 8
FIG. 9
PRIOR ART
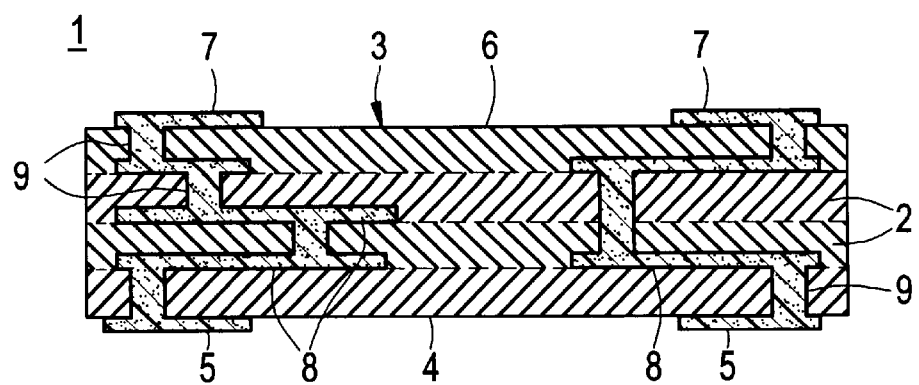

MONOLITHIC CERAMIC ELECTRONIC COMPONENT, METHOD FOR MANUFACTURING THE SAME, AND ELECTRONIC DEVICE

BACKGROUND OF THE INVENTION

1. Field of the Invention

The present invention generally relates to monolithic ceramic electronic components, methods for manufacturing the same, and electronic devices including the monolithic ceramic electronic components. More particularly, the present invention relates to an improvement in the structure of terminals of monolithic ceramic electronic components.

2. Description of the Related Art

A conventional type of monolithic ceramic electronic component, which relates to the present invention, is known as a "monolithic ceramic substrate". The monolithic ceramic electronic component includes a composite body having a multilayered structure including a plurality of ceramic layers.

Inside the composite body, interconnecting conductors are provided to constitute a desired circuit by using passive elements such as capacitors and inductors. Outside the composite body, an active element such as a conductor IC chip and a portion of a passive element as required are mounted.

The resulting monolithic ceramic electronic component is mounted on a desired interconnection substrate and constitutes a desired electronic device.

The monolithic ceramic electronic component is used as an LCR composite high-frequency component for use in mobile communication terminal devices, and as a composite component combining an active element such as a semiconductor IC chip and a passive element such as a capacitor, an inductor, and a resistor, or simply as a semiconductor IC package for use in computers.

More particularly, the monolithic ceramic electronic component is widely used to constitute various kinds of electronic components such as module substrates, RF diode switches, filters, chip antennas, various package components, composite devices, etc.

FIG. 9 is a sectional view illustrating a conventional monolithic ceramic electronic component. A monolithic ceramic electronic component 1 shown in FIG. 9 includes a composite body 3 including a plurality of stacked ceramic layers 2. The composite body 3 is provided with interconnecting conductors each of which is located in association with a particular ceramic layer 2.

The interconnecting conductors are several first terminals 5 arranged on a first end surface 4 in the stacking direction of the composite body 3, several second terminals 7 arranged on a second end surface 6 opposite to the first end surface 4 of the composite body 3, several internal conductor layers 8 disposed at a particular interface between the ceramic layers 2, and several via-hole conductors 9 penetrating a specific ceramic layer 2.

The first terminal 5 is used for forming a connection with an interconnection substrate (not shown). In order to improve the bonding strength with the interconnection substrate, the first terminal 5 includes a conductor layer defined by a conductive paste that is applied by printing.

The second terminal 7 is used for forming a connection with a mounted component (not shown). In order to improve the bonding strength with the mounted component, as in the first terminal 5, the second terminal 7 includes a conductor layer defined by a conductive paste that is applied by printing.

FIGS. 10A to 10E show, in sequence, part of a typical method for manufacturing the monolithic ceramic electronic component 1 shown in FIG. 9. As shown in FIG. 10A, a ceramic green sheet 11, which will form the ceramic layer 2, is formed on a carrier film 10 of polyethylene terephthalate having a thickness of 50 $\mu$m to 100 $\mu$m. In this way, a composite sheet 12 in which the ceramic green sheet 11 is supported by the backing carrier film 10 is obtained.

During the subsequent steps, prior to a stacking step of the ceramic green sheet 11, the ceramic green sheet 11 is handled in the form of the composite sheet 12.

The reason for working the ceramic green sheet 11 with the carrier film 10 functioning as an undercoat is that the ceramic green sheet 11 has significantly low strength, is soft, and is breakable, and it is extremely difficult to handle the ceramic green sheet 11 by itself. The ceramic green sheet 11 in the form of the composite sheet 12 is easy to handle and to align during the process. Also, undesirable shrinking and undulation of the ceramic green sheet 11 can be prevented during the subsequent step of drying the conductive paste.

Next, as shown in FIG. 10B, several through holes 13 for forming the via-hole conductors 9 are formed in the composite sheet 12. Alternatively, the through holes 13 may be formed so as not to penetrate the carrier film 10 and may be formed only in the ceramic green sheet 11.

Next, as shown in FIG. 10C, by filling the through hole 13 with a conductive paste, a conductive paste section 14 which will be the via-hole conductor 9 is formed. At the same time, the conductive paste layer 15, which will be the internal conductor layer 8 or a second terminal 7, is formed by applying a conductive paste on the outer main surface of the ceramic green sheet 11. Subsequently, the conductive paste section 14 and the conductive paste layer 15 are dried.

Next, as shown in FIG. 10D, after the carrier film 10 is separated from the ceramic green sheet 11, a plurality of ceramic green sheets 11 are stacked so as to define a green composite body 16 which is the composite body 3 before firing.

The separation of the carrier film 10 may be performed prior to the stacking of the ceramic green sheet 11 as in the above description. The arrangement may be such that the ceramic green sheet 11 is stacked in the form of the composite sheet 12, having the surface provided with carrier film 10 facing upward, and the carrier film 10 is separated every time one of the ceramic green sheets 11 is stacked.

Next, as shown in FIG. 10E, a conductive paste layer 17, which will be the first terminal 5, is formed by applying a conductive paste on one end surface of the green composite 16 by printing. The conductive paste layer 17 is then dried.

It should be noted that the conductive paste layer 17, formed after the green composite 16 is obtained, may be used for the second terminal 7 and not for the first terminal 5. In such a case, the conductive paste layer for the first terminal 5 is provided by the conductive paste layer 15 formed by the step shown in FIG. 10C.

Next, the green composite 16 in the state shown in FIG. 10E is pressed in the stacking direction and is fired. Thus, the monolithic ceramic electronic component 1 shown in FIG. 9 is obtained.

The first terminal 5 and the second terminal 7 are plated with nickel and are then further plated with gold, tin, or solder, as required.

Although not shown in the drawings, the monolithic ceramic electronic component 1 is mounted on an interconnection substrate arranged to oppose the first end surface 4 so as to electrically connect via the conductive layer that constitutes the first terminal 5. A component is mounted on the second end surface 6 and is electrically connected with the conductive layer that constitutes the second terminal 7, but this is also not shown.

According to the manufacturing method of the monolithic ceramic electronic component 1 shown in FIG. 10, a step for applying the conductive paste by printing and a step for drying the same must be performed once again subsequent to obtaining the green composite body 16 in order to form the conductive paste layer 17 shown in FIG. 10E. Thus, there is a problem of reduced production efficiency due to these extra printing and drying steps.

It is also possible to use another process in which the conductive paste layer 17 is applied by printing, is dried, and is fired after firing the green composite body 16 in the state shown in FIG. 10D. In this case also, there is a problem of reduced production efficiency as in the above.

Since a screen printing technique is generally used in applying the conductive paste layer 17, reliability of the screen printing from the point of view of precision is not satisfactory. Accordingly, there is a problem of improper formation and displacement of the conductive paste layer 17, smudges in the patterns thereof, and irregularities in the thickness.

When a defective mother composite from which a plurality of the monolithic ceramic electronic components 1 are obtained, is used, all of the resulting monolithic ceramic electronic components 1 may be defective.

It should be noted that during the process in which the conductive paste layer 17 is formed after firing, it is possible to remove the conductive paste layer 17 and perform the printing step again when the above-described problems occur. It is, however, impossible to repair these defects in a process in which the conductive paste layer 17 is applied by printing prior to firing.

Furthermore, during the steps of pressing and firing the green composite body 16, the ceramic green sheet 11 and the ceramic layer 2 tends to be distorted in the direction of the main surfaces thereof. Accordingly, when printing is performed to form the conductive paste layer 17 on the mother composite, the conductive paste layer 17 may be misplaced due to the distortion.

After the step of pressing the green composite body 16, deflection may be found in the green composite body 16 or in the composite 3 after the firing. Thus, the surface on which the conductive paste layer 17 is applied by printing becomes irregular, resulting in the degraded precision of the printing.

Furthermore, the size of the components mounted on the second end surface 6 of the monolithic ceramic electronic component 1 is decreasing. For a mounted component provided with sheet-type terminal electrodes, such as a surface-mounted component, the plane size of each terminal electrode is now reduced to 0.6 mm×0.3 mm. For a mounted component provided with bump electrodes such as a semiconductor IC chip, the size of each bump electrode is reduced to, for example, approximately 70 $\mu$m in diameter, and the array pitch thereof is reduced to approximately 150 $\mu$m. Accordingly, the conductive layer used as the second terminal 7 must be reduced in size, but the screen printing technique is not capable of forming the conductive layer having such high precision.

Furthermore, an electronic component electrically connected by wire bonding, such as a semiconductor IC chip, is also used as the mounted component. In such a case, the diameter of the bonding wire is approximately 20 $\mu$m, and the width of a pad element required for wire bonding is approximately 80 $\mu$m. When the conductive layer formed by screen printing is used as the pad element, the cross-section of the thus formed conductive layer shows that there is a beveled part of approximately 20 $\mu$m to 30 $\mu$m wide at each edge due to surface tension of the conductive paste. Consequently, the flat portion of the pad element 80 $\mu$m in width becomes narrow, resulting in joining failure of the bonding wires.

SUMMARY OF THE INVENTION

In order to overcome the problems described above, preferred embodiments of the present invention provide a monolithic ceramic electronic component, a method for manufacturing the same, and an electronic device including the monolithic ceramic electronic component, all of which are free of the above-described problems experienced in the conventional art.

A monolithic ceramic electronic component according to a first preferred embodiment of the present invention includes a composite body having a plurality of stacked ceramic layers. The ceramic layers include interconnecting conductors provided in each of the ceramic layers and including first terminals arranged on a first end surface in the stacking direction of the composite body so as to define connections with an interconnection substrate, and second terminals arranged on a second end surface opposite of the first end surface of the composite arranged to define connections with a mounted component. The first terminals include conductor layers provided on the first end surface and the second terminals include exposed end surfaces of terminal via-hole conductors that extend from the inner portion of the composite to the second end surface.

As described above, the first terminal, arranged on the first end surface of the composite body, for providing a connection to the interconnection substrate, is defined by the conductor layer provided on the first end surface. The second terminal, arranged on the second end surface of the composite body so as to define a connection to the mounted component, is defined by the exposed end surface of the terminal via-hole conductor which extends from the inner portion of the composite body to the second end surface.

Accordingly, when manufacturing a green composite body for obtaining the composite body to be accommodated in the multilayer ceramic electronic component, through holes are made in the ceramic green sheets constituting the green composite body, and the conductive paste fills inside the through holes so as to form conductive paste sections which will function as via-hole conductors. The conductive paste is applied merely on one of the main surfaces of the respective ceramic green sheet so as to form the conductive paste layer that functions as a conductive layer.

During the above-described steps, the ceramic green sheet is preferably handled with the supporting carrier film until the stacking step begins. The formation of the through holes and the application of the conductive paste for forming the conductive paste sections and the conductive paste layer can be performed while having the carrier film supporting the ceramic green sheet.

As a result, the precision of printing, for example, for applying the conductive paste is improved, the size of the monolithic ceramic electronic component can be reduced, and density of the interconnections can be increased.

Also, a printing step does not need to be repeated after the green composite is prepared or fired. Thus, failures which may occur during the printing step are reliably eliminated, resulting in a greatly improved yield and reduced cost.

Furthermore, since the second terminal for connecting to the mounted component is constituted by the exposed end surface of the terminal via-hole conductor, the size of the second terminal can be easily reduced, and consequently, the aligning pitch can be reduced. These factors also contribute to the miniaturization of the monolithic ceramic electronic component and increased density of the interconnections.

Preferably, the exposed end surfaces of the terminal via-hole conductors are flat and are arranged on substantially the same plane as the second end surface.

In this manner, the electronic component to be mounted on the second end surface by a surface-mounting technique is prevented from undesirable tilting. The resulting exposed end surfaces are especially suitable for wire bonding and bump interconnection.

Preferably, the interconnecting conductors further include an interconnecting via-hole conductor for providing interconnections inside the composite body and the terminal via-hole conductor has a different cross sectional size from that of the interconnecting via-hole conductor.

In this configuration, it is easy to select a suitable cross sectional size for the via-hole conductors.

More preferably, the cross sectional size of the terminal via-hole conductor is larger than that of the interconnecting via-hole conductor.

In this manner, the area of the exposed end surface of the terminal via-hole conductor which functions as the second terminal is relatively large. Consequently, this configuration is more suitable for mounting an electronic component including sheet-like terminal electrodes and for mounting a metallic casing.

Preferably, the mounted component includes an electronic component having sheet-type terminal electrodes. The surfaces of the terminal electrodes are joined to oppose the end surfaces of the terminal via-hole conductors to fix the electronic component.

Preferably, the mounted component includes a metallic casing that covers the second end surface. The edge surfaces of the metallic casing are joined to oppose the end surfaces of the terminal via-hole conductors to fix the electronic component.

Preferably, the cross sectional size of the terminal via-hole conductor is smaller than that of the interconnecting via-hole conductor.

When the cross sectional size of the terminal via-hole conductor is smaller than that of the interconnecting via-hole conductor, the density for mounting components is greatly improved, and the resulting configuration is more suitable for mounting an electronic component including bump electrodes and an electronic component to be electrically connected by wire bonding.

Preferably, the mounted component includes an electronic component having bump electrodes and the mounted component is joined to the end surfaces of the terminal via-hole conductors through the bump electrodes.

Preferably, the mounted component is an electronic component electrically connected by wire bonding. The mounted component is electrically connected to the end surfaces of the terminal via-hole conductors through bonding wires.

Preferably, a monolithic ceramic electronic component further includes a cavity having an opening along the first end surface.

In this manner, the electronic component can be accommodated in the cavity, achieving further miniaturization of the multifunctional monolithic ceramic electronic component.

A method for manufacturing a monolithic ceramic electronic component according to another preferred embodiment of the present invention includes the steps of preparing a composite sheet including a ceramic green sheet and a supporting carrier film, forming through holes which penetrate at least the ceramic green sheet in the composite sheet, forming a conductive paste section by filling the through hole with a conductive paste, forming a conductive paste layer by applying the conductive paste on the outer main surface of the ceramic green sheet of the composite sheet, separating the carrier film from the ceramic green sheet, forming a green composite body by stacking the plurality of the ceramic green sheets, and firing the green composite body. At least a portion of the conductive paste layers defines the conductive layer constituting the first terminal and at least a portion of the conductive paste sections defines the terminal via-hole conductor.

An electronic device according to yet another preferred embodiment of the present invention includes a monolithic ceramic electronic component, an interconnection substrate for mounting the monolithic ceramic electronic component, the interconnection substrate facing the first end surface of the composite and electrically connected through the conductor layer which constitutes the first terminal, and a component mounted on the second end surface of the composite, which is electrically connected through the end surface of the terminal via-hole conductors.

Because the monolithic ceramic electronic component has a reduced size and allows increased density of interconnections, the electronic device equipped with such a monolithic ceramic electronic component also achieves the same advantages and benefits. The electronic device of this preferred embodiment of the present invention is multifunctional and is greatly reduced in size.

Other features, elements, advantages and characteristics of the present invention will become more apparent from the detailed description of preferred embodiments thereof with reference to the attached drawings.

BRIEF DESCRIPTION OF THE DRAWINGS

FIG. 7 is a sectional view illustrating a monolithic ceramic electronic component according to yet another preferred embodiment of the present invention;

FIG. 8 is a sectional view illustrating a monolithic ceramic electronic component according to still another preferred embodiment of the present invention;

FIG. 9 is a sectional view illustrating a conventional monolithic ceramic electronic component which relates to the present invention.

DETAILED DESCRIPTION OF PREFERRED EMBODIMENTS

Figure 1:
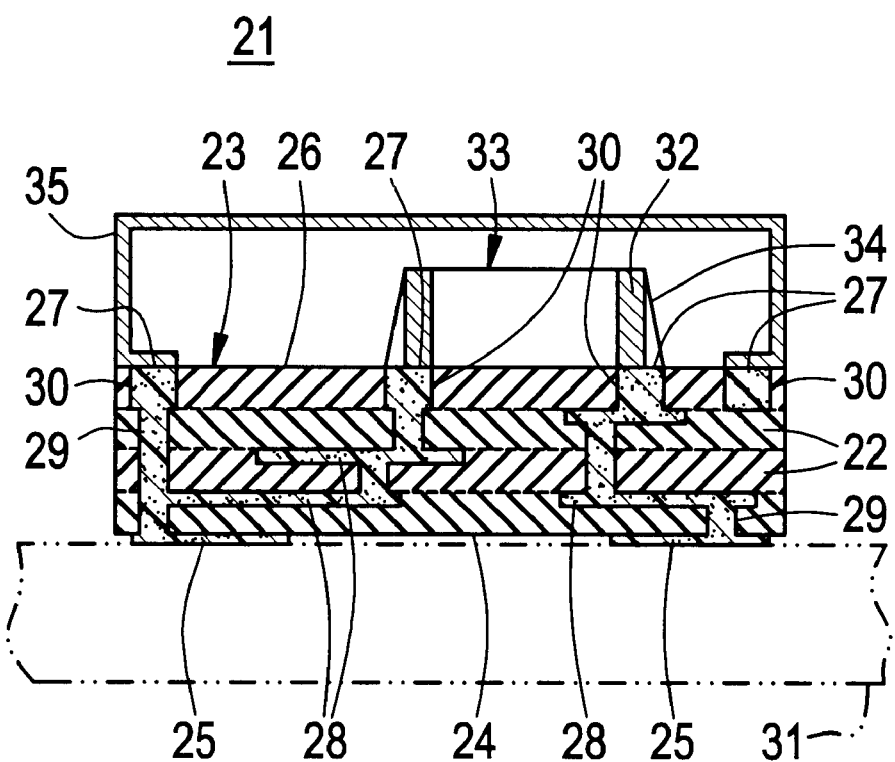
FIG. 1 is a sectional view illustrating a monolithic ceramic electronic component according to a preferred embodiment of the present invention.

FIG. 1 is a sectional view illustrating a monolithic ceramic electronic component 21 according to a preferred embodiment of the present invention.

The monolithic ceramic electronic component 21 preferably includes a composite body 23 having a plurality of stacked ceramic layers 22. The composite body 23 is provided with various interconnecting conductors each of which is formed in association with a particular ceramic layer 22.

For the above-described interconnecting conductors, there are provided several first terminals 25 arranged on a first end surface 24 in the stacking direction of the composite body 23, several second terminals 27 arranged on a second end surface 26 opposite to the first end surface 24 of the composite body 23, several internal conductor layers 28 disposed along a particular interface between the ceramic layers 22, and several via-hole conductors 29 and 30 arranged to penetrate through a specific ceramic layer 22.

The above-described first terminal 25 includes a conductor layer disposed on the first end surface 24 and defines a connection with an interconnection substrate 31 shown by a phantom line in FIG. 1. More particularly, while disposing the interconnection substrate 31 to oppose the first end surface 24, the monolithic ceramic electronic component 21 is mounted on the interconnection substrate 31 and is electrically connected to the interconnection substrate 31 through a conductor layer that constitutes the first terminal 25.

A second terminal 27 is constituted by an exposed end surface of the terminal via-hole conductor 30 extending from the inner portion of the composite body 23 to a second end surface 26. The via-hole conductor 30 of this preferred embodiment has a larger cross sectional size than does the interconnecting via-hole conductor 29 for forming interconnections inside the composite 23. The second terminal 27 defines a connection with a component mounted on the second end surface 26. Only the via-hole conductor 30 is exposed on the second end surface 26. The via-hole conductors provided in the same ceramic layer 22 have the same diameter size.

This preferred embodiment includes, as the above-described mounting component, an electronic component 33 having a sheet-type terminal electrode 32, such as a surface-mounting component.

There are electronic components of various sizes available on the market as the electronic component 33. When the plane size of the electronic component is 1.0 mm×0.5 mm, the plane size of the terminal electrode 32 is approximately 0.25 mm×0.5 mm. Thus, the cross sectional size of the terminal via-hole conductor 30 is selected to be approximately the same as the size of the terminal electrode 32, that is, about 0.4 mm in diameter. When the plane size of the electronic component 33 is 0.6 mm×0.3 mm, the plane size of the terminal electrode 32 is approximately 0.15 mm×0.3 mm. Thus, the cross sectional size of the terminal via-hole conductor 30 is selected to be approximately 0.3 mm in diameter.

The section of the terminal via-hole conductor 30 is not limited to a substantially circular shape and may also be a substantially rectangular shape or other suitable shape.

Preferably the terminal via-hole conductor 30 includes fine micropores therein. These micropores control shrinking of the via-hole conductor 30 during firing and thus, a terminal electrode having a desired height can be produced.

At the second end surface 26, all the terminals for mounting components are formed by the via-hole conductor 30. Other via holes for leading to a surface circuit may be formed by the regular via-hole conductor 29.

The electronic component 33 is arranged so that the terminal electrode 32 opposes the end surface of the terminal via-hole conductor 30 functioning as the second terminal 27. The electronic component 33 is then mounted on the monolithic ceramic electronic component 21 by joining the terminal electrode 32 to the exposed end surface of the terminal via-hole conductor 30 by, for example, solder or a conductive adhesive 34.

During the above-described joining step of the electronic component 33, the end surface of the terminal via-hole conductor 30 is preferably flat and on the substantially same plane as the second end surface 26 in order to prevent the electronic component 33 from tilting undesirably, in other words, to prevent a so-called "tomb stone phenomenon". In order for the terminal via-hole conductor 30 to have a flat end surface in substantially the same plane as the second end surface 26, the shrinking of the ceramic layer 22 and the shrinking of terminal via-hole conductor 30 are adjusted to be the same.

In contrast, the cross sectional size of the via-hole conductor 29 for defining interconnections is selected to be approximately 50 μm to approximately 150 μm in diameter. The reason for setting the cross sectional size of the interconnecting via-hole conductor 29 to such a reduced size is as follows.

In order to reduce the size of the monolithic ceramic electronic component 21 and increase the density of the interconnections, it is necessary to reduce the pitch of the interconnecting via-hole conductor 29 to approximately 0.1 mm to approximately 0.5 mm. On the other hand, during the firing step, the shrinkage rate, and the temperature at which firing shrinkage begins, differ between the ceramic layer 22 and the interconnecting via-hole conductor 29. Thus, when the cross sectional size of the interconnecting via-hole conductor 29 is increased at the same time the pitch of the interconnecting via-hole conductor 29 is decreased, the ceramic layer 22 may crack at the portion between the interconnecting via-hole conductor 29, leading to a severe defect. Accordingly, the cross sectional size of the interconnecting via-hole conductor 29 is preferably not increased.

In this preferred embodiment, a metallic casing 35 is also mounted on the second end surface 26 of the composite 23 as the mounted component. The metallic casing 35 is placed over the second end surface 26 so as to cover the electronic component 33. The edge surface of the metallic casing 35 and the end surface of the via-hole conductor 30 which functions as the second terminal 27 are arranged to oppose one another and are joined by soldering, or other suitable process.

It should be noted that some of the terminal via-hole conductors 30 joined to the metallic case 35 that do not need to be electrically connected to the interconnecting conductor inside of the composite 23, may be formed without connecting to other interconnecting conductors, such as the terminal via-hole conductor 30 illustrated at the right end of FIG. 1.

FIG. 2 is a sectional view illustrating in sequence the typical steps of a method for manufacturing the monolithic ceramic electronic component 21 shown in FIG. 1.

Figure 2A:
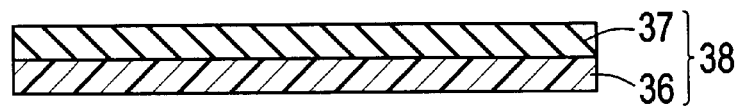
FIGS. 2A to 2E are sectional views illustrating in sequence some of the steps in a method for manufacturing the monolithic ceramic electronic component shown in FIG. 1.

As shown in FIG. 2A, a ceramic green sheet 37 that constitutes the ceramic layer 22 is formed on a carrier film 36. Thus, a composite sheet 38 in which the ceramic green sheet 37 is supported by the carrier film 36 is obtained. The carrier film 36 is preferably made of polyethylene terephthalate and has a thickness of about 50 μm to about 100 μm.

The ceramic green sheet 37 is handled in the form of the composite sheet 38 until a stacking step begins. The reason for this is, as in the case of the conventional art described referring to FIG. 10, to reinforce the soft and breakable ceramic green sheet 37 having extremely low strength, to facilitate handling and alignment in each of the steps, and to prevent a conductive paste for the internal conductor layer 28 and via-hole conductors 29 and 30 from shrinking and developing irregularities during drying.

Figure 2B:
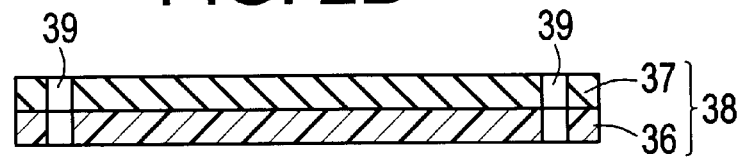

Next, as shown in FIG. 2B, a through hole 39 is formed in the composite sheet 38 by drilling, punching, laser beam processing, or other suitable process. The through hole 39 is used for forming the via-hole conductors 29 and 30 and the size thereof is selected to match the cross sectional size of the via-hole conductors 29 and 30, respectively.

During the step shown in FIG. 2B, the through hole 39 may be formed only in the ceramic green sheet 37.

Figure 2C:
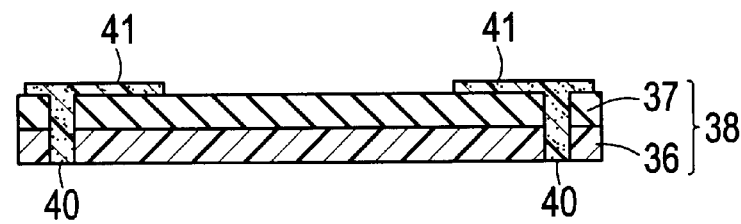

Next, a conductive paste having Ag, Ag/Pd, Ag/Pt, Cu, Cuo, Ni, for example, or other suitable material, as a main component is prepared. The conductive paste fills the through hole 39 as shown in FIG. 2C and is dried. Thus, a conductive paste section 40 is located in each of the through holes 39.

As shown in FIG. 2C, a conductive paste layer 41 is formed on the main surface of the ceramic green sheet 37 facing outward by applying and drying the conductive paste in a desired pattern. The conductive paste layer 41 functions as a conductor layer constituting the first terminal 25 or as the internal conductor layer 28 in the resulting monolithic ceramic electronic component 21.

In forming the above-described conductive paste section 40 and the conductive paste layer 41, a printing technique such as screen-printing is preferably used. Either one of the conductive paste section 40 and the conductive paste layer 41 may be formed prior to the other, or both may be formed simultaneously.

In order to form micropores in the fired via-hole conductor, the conductive paste section 40 preferably includes a resin powder (for example, a polypropylene resin powder) that does not dissolve into the paste and is evaporated at the time of firing.

Preferably, the resin powder is contained in a ratio of about 3% to about 40% by volume (more preferably, about 15% to about 25% by volume) of the total volume of the conductive paste section 40 from the point of view of shrinking behavior control and enhancing conductivity. Also from the same point of view, an average grain diameter of the resin powder is preferably about 0.1 μm to about 75 μm (more preferably, about 5 μm to about 50 μm).

When the conductive paste for forming the conductive paste section 40 and the conductive paste layer 41 is being dried after the application, the ceramic green sheet 37 shrinks. When the ceramic green sheet 37 is alone handled, variation in the shrinking rate is approximately ±0.15%. When the ceramic green sheet is supported by the carrier film 36, variation in the shrinking rate is reduced to about ±0.02% or less.

It is to be noted that when the ceramic green sheet 37 is expected to be later divided to obtain a plurality of composite bodies 23, the size of such a ceramic green sheet 37 is generally approximately 100 mm×100 mm or more. Suppose the size of the ceramic green sheet 37 is approximately 100 mm×100 mm. When the carrier film 36 is not provided as an undercoat and when a variation rate of shrinking is approximately ±0.15%, there will be a variation of approximately ±150 μm. When the carrier film 36 is provided as an undercoat and when a variation rate of shrinkage is approximately ±0.02% or less, there will be a variation of about 20 μm or less. This shows how significant an effect the carrier film 36 can yield. During a step of stacking the ceramic green sheet 37 described later, shrinkage variation is preferably about ±30 μm or less in order to precisely perform stacking. Thus, the above value of ±20 μm satisfies this requirement.

Figure 2D:
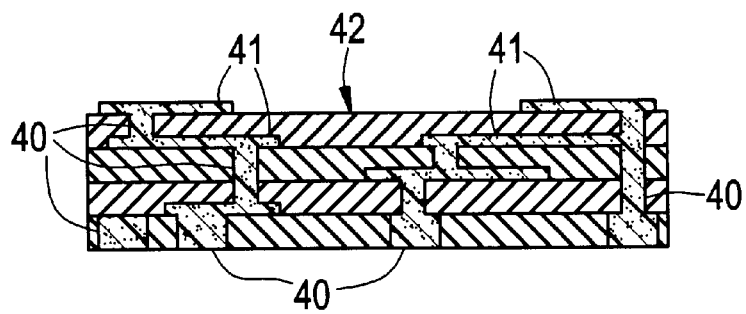

Next, as shown in FIG. 2D, the carrier film 36 is separated from the ceramic green sheet 37. A plurality of ceramic green sheets 37 are stacked to define the composite body 23 in a green state, i.e., a green composite 42.

Figure 3:
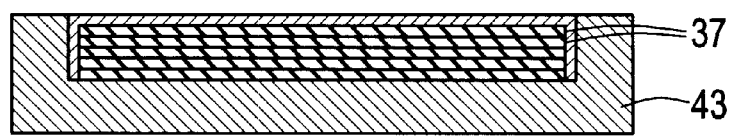
FIG. 3 is a sectional view for explaining a first stacking process to obtain a green composite body shown in FIG. 2D.
Figure 4:
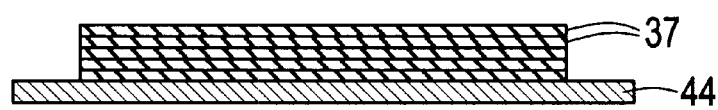
FIG. 4 is a sectional view for explaining a second stacking process to obtain the green composite body shown in FIG. 2D.
Figure 5:
FIG. 5 is a sectional view for explaining a third stacking process to obtain the green composite body shown in FIG. 2D.

In order to form the green composite 42, any one of the methods for stacking shown in FIGS. 3, 4, and 5 can be used.

In a stacking method shown in FIG. 3, the carrier film 36 is separated first while the ceramic green sheet 37 is held by vacuum suction and then the ceramic green sheets 37 are stacked inside a metal mold 43 having a predetermined shape. Although the ceramic green sheets 37 are simply stacked inside the metal mold 43, the ceramic green sheet 37 is not significantly displaced since the clearance between the metal mold 43 and the ceramic green sheet 37 is small, e.g., approximately 50 μm.

In a stacking method shown in FIG. 4, as in the above-described stacking method, the carrier film 36 is separated while the ceramic green sheet 37 is held by vacuum suction. Then, the ceramic green sheets 37 are stacked on a base plate 44 including metal or resin. When the ceramic green sheets 37 are being stacked, heat and pressure are applied every time one ceramic green sheet 37 is stacked so that the ceramic green sheets 37 are temporarily press-bonded to one another by binding force of a binder and a plasticizer contained in the ceramic green sheet 37.

In a stacking method shown in FIG. 5, the ceramic green sheets 37 are stacked on a base plate 45 including metal or resin. During this stacking step, the carrier film 36 faces upward and heat and pressure are applied through the carrier film 36 so as to temporarily press-bond the ceramic green sheets 37 by binding force of a binder and a plasticizer contained in the ceramic green sheet 37. Then, the carrier film 36 is separated and the same step is repeated every time one ceramic green sheet 37 is stacked.

The green composite 42 obtained by one of the above-described methods has, as shown in FIG. 2D, the conductive paste layer 41 for forming the first terminal 25 provided on one end surface in the stacking direction. On the opposite end surface, an end surface of the conductive paste section 40 which functions as the second terminal 27 is exposed.

Next, the green composite 42 is pressed in the stacking direction. The ceramic green sheets 37 are press-bonded to one another and the exposed end surface of the conductive paste section 40, which will be the second terminal 27, has improved flatness.

Figure 2E:
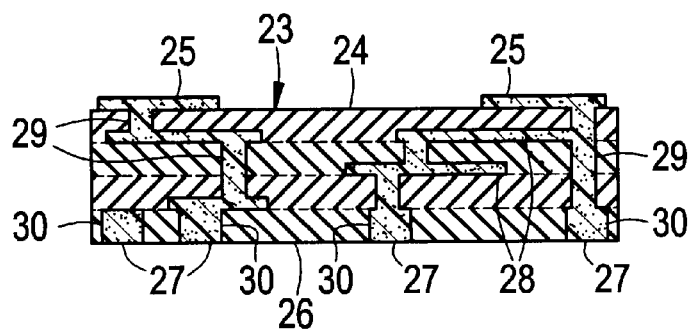

Next, the green composite 42 is fired. The composite 23 is obtained after sintering as shown in FIG. 2E. At this stage, the shrinking of the conductive paste section 40 which will be the second terminal 27 is adjusted so that it will match the shrinking of the ceramic green sheet 37 as much as possible.

After the composite body 23 is obtained by sintering as described above, a printed resistor or an insulating layer is formed on the second end surface 26 of the composite body 23 as necessary. The conductor layer which constitutes the first terminal 25 and the exposed end surface of the terminal via-hole conductor 30 are plated by, for example, nickel, and may be further plated by gold, tin, or solder, or other suitable material, as necessary.

The composite 23 in FIG. 2E is shown upside-down compared to the composite 23 in FIG. 1.

Next, as shown in FIG. 1, the electronic component 33 is mounted on the second end surface 26 of the composite 23, and the metallic case 35 is attached. Alternatively, the electronic component 33 may be sealed by filling the inner portion of the metallic case 35 with resin.

Figure 6:
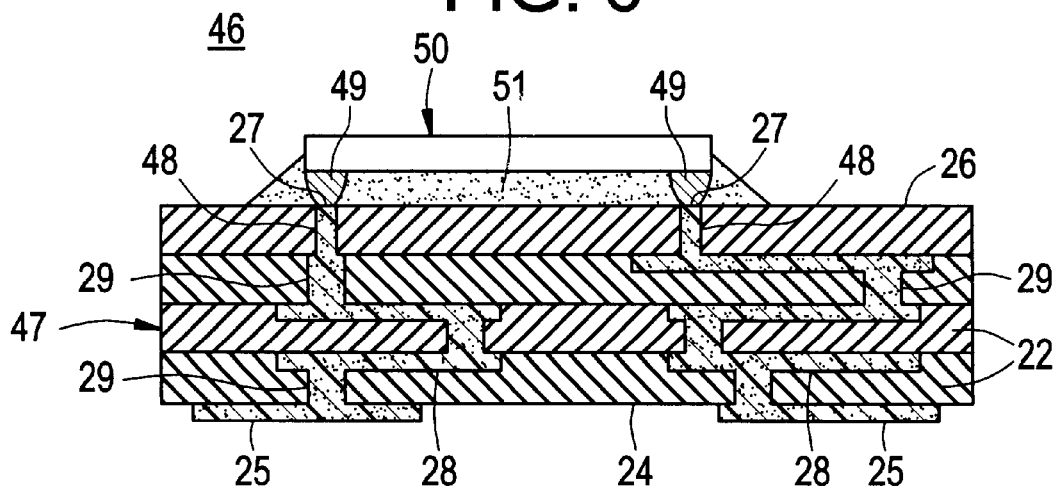
FIG. 6 is a sectional view illustrating a monolithic ceramic electronic component according to another preferred embodiment of the present invention.
Figure 10A:
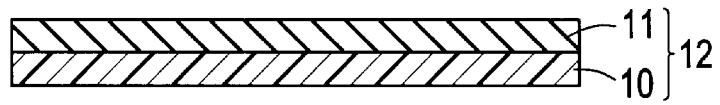
FIGS. 10A–10E is a sectional view illustrating in sequence some of the steps in a method for manufacturing a monolithic ceramic electronic component 1 shown in FIG. 9.
Figure 10B:
Figure 10C:
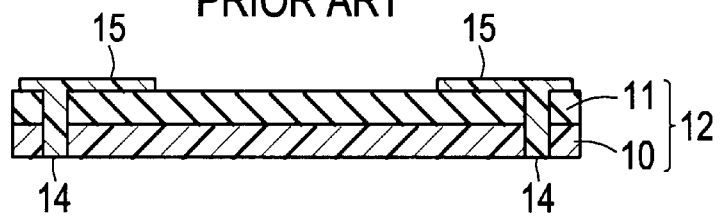
Figure 10D:
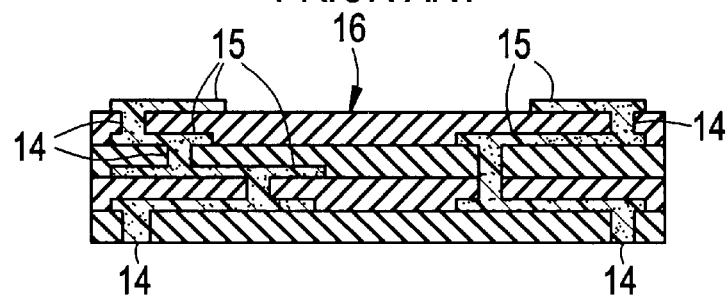
Figure 10E:
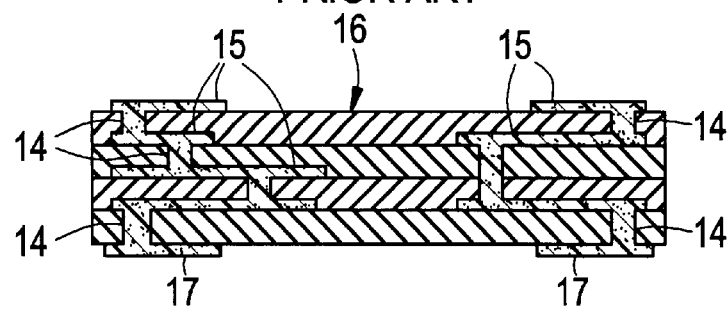

FIG. 6 is a sectional view illustrating a monolithic ceramic electronic component 46 according to another preferred embodiment of the present invention. In FIG. 6, the same reference numerals are used to designate the same elements as those shown in FIG. 1 so as to avoid duplication of the description.

A composite 47 included in the monolithic ceramic electronic component 46 shown in FIG. 6 is characterized by a terminal via-hole conductor 48. The cross sectional size of the terminal via-hole conductor 48 is preferably smaller than that of the connection via-hole conductor 29.

In this preferred embodiment, an electronic component 50 having bump electrodes 49 is mounted on the second end surface 26 of the composite 47. The electronic component 50 is joined to the end surface of the terminal via-hole conductor 48 functioning as the second terminal 27 through the bump electrodes 49.

Each bump electrode 49 is made of solder or gold and is about 50 $\mu$m to about 100 $\mu$m in diameter. As described above, the diameter of the bump electrode 49 is smaller than the diameter of the interconnecting via-hole conductor 29 which is about 50 $\mu$m to about 150 $\mu$m. Accordingly, when joining is performed through the bump electrodes 49, it is preferable that the cross sectional size of the terminal via-hole conductor 48 be smaller than the cross sectional size of the interconnecting via-hole conductor 29 in order to increase the density of the interconnections.

The section of the terminal via-hole conductor 48 of this preferred embodiment is not limited to a substantially circular shape and may also have a substantially rectangular shape, or other suitable shape.

In this preferred embodiment, the joined portion with the bump electrodes 49 is sealed with a resin 51.

FIG. 7 is a sectional view illustrating a monolithic ceramic electronic component 52 according to yet another preferred embodiment of the present invention. In FIG. 7, similar elements to those in FIGS. 1 and 6 are indicated by the same reference numerals to avoid duplication of description.

A composite body 53 included in the monolithic ceramic electronic component 52 shown in FIG. 7 is, as in the preferred embodiment shown in FIG. 6, characterized in having an interconnecting via-hole conductor 54 having a smaller cross sectional size than that of the interconnecting via-hole conductor 29.

In this preferred embodiment, an electronic component 55 electronically connected by wire bonding is mounted on the second end surface 26 of the composite 53. The electronic component 55 is electronically connected to the end surface of the interconnecting via-hole conductor 54 which functions as the second terminal 27 through bonding wires 56.

The bonding wires 56 are preferably formed of gold, aluminum, or copper, or other suitable material and each bonding wire 56 has a diameter of approximately 20 $\mu$m to about 30 $\mu$m. Accordingly, it is preferable that the cross sectional size of the interconnecting via-hole conductor 54 is smaller than the diameter of the interconnecting via-hole conductor which is approximately 50 $\mu$m to about 150 $\mu$m in order to increase the density of interconnections.

In this preferred embodiment also, the section of the interconnecting via-hole conductor 54 is not limited to a substantially circular shape and may also have a substantially rectangular shape, for example, or other suitable shape.

When the connection is achieved by the bump electrodes 49 as in the preferred embodiment shown in FIG. 6 and when the connection is achieved by the bonding wires 56 as in the preferred embodiment shown in FIG. 7, the end surfaces of the terminal via-hole conductors 48 and 54 are required to be flat and the coplanarity between these end surfaces and the second end surface 26 is preferably about 20 $\mu$m or less. In order to obtain such flatness and coplanarity, the cross sectional size of the terminal via-hole conductors 48 and 54 is preferably small. From this point of view also, the cross sectional size of the respective terminal via-hole conductors 48 and 54 is preferably small for the preferred embodiments shown in FIGS. 6 and 7.

FIG. 8 is a sectional view illustrating a monolithic ceramic electronic component 57 according to still another preferred embodiment of the present invention. In FIG. 8, elements corresponding to those in FIG. 1 are indicated by the same reference numerals to avoid duplication of the description.

A composite body 58 included in the monolithic ceramic electronic component 57 shown in FIG. 8 has a cavity 60 in which an opening 59 is arranged along the first end surface 24. In the cavity 60, a step part 61 is provided and a pad electrode 62 is provided on the surface of the step part 61 which faces toward the opening 59.

An electronic component 63, such as a semiconductor IC chip, for example, or other suitable component, is accommodated inside the cavity 60. The electronic component 63 is electrically connected to the pad electrode 62 through bonding wires 64.

The inner portion of the cavity 60 may be filled with a resin 65 so as to seal the electronic component 63. Alternatively, the electronic component 63 may be covered by a casing, although this is not shown in the drawing.

An electronic component 67 having terminal electrodes 66 is mounted on the second end surface 26 of the composite 58. Each terminal electrode 66 of the electronic component 67 is joined to the end surface of the terminal via-hole conductor 30 which functions as the second terminal 27 through a solder 68.

The above-described electronic component 67 may be covered by a casing 69 as indicated by a dotted line in FIG. 8, or may be sealed by resin, although this is not shown in the drawing.

According to the preferred embodiment shown in FIG. 8, the terminals which are provided on the composite body 58 and which provide electrical connections for the mounting component can be used flexibly and interchangeably. For example, when joining by the bonding wires 64 are performed, the pad electrode 62 formed by printing is more suitable than the end surface of the terminal via-hole conductor 30. In such a case, the pad electrode 62 is used to perform wire bonding. In contrast, when joining by soldier solder is performed, the terminal via-hole conductor 30 is more suitable than the pad electrode 62. In such a case, the end surface of the terminal via-hole conductor 30 is used to perform solder joining.

What is claimed is:

1. A monolithic ceramic electronic component, comprising:

a composite body having a plurality of stacked ceramic layers, the plurality of ceramic layers including:

interconnecting conductors provided in each of the ceramic layers, including first terminals, arranged on a first end surface in the stacking direction of the composite body to define connections with an interconnection substrate, second terminals, arranged on a second end surface opposite of the first end surface of the composite to define connections with a mounted component, and interconnecting via-hole conductors inside the composite body;

wherein the first terminals include conductor layers provided on the first end surface and the second terminals include exposed end surfaces of terminal via-hole conductors which extend from the inner portion of the composite body to the second end surface; and the second terminals have a substantially constant cross sectional size along the entire length thereof that is different from that of the of the interconnecting via-hole conductors.

2. A monolithic ceramic electronic component according to claim 1, wherein the exposed end surfaces of the terminal via-hole conductors are flat and are arranged on substantially the same plane as the second end surface.

3. A monolithic ceramic electronic component according to claim 1, wherein the cross sectional size of the terminal via-hole conductors is larger than that of the interconnecting via-hole conductors.

4. A monolithic ceramic electronic component according to claim 3, wherein the mounted component is an electronic component having sheet-type terminal electrodes, and the end surfaces of the terminal via-hole conductors are joined to the surface of the corresponding terminal electrode to fix the mounted component.

5. A monolithic ceramic electronic component according to claim 4, wherein the mounted component is a metallic casing which covers the second end surface, and the edge surfaces of the metallic casing is joined to the end surfaces of the terminal via-hole conductors to fix the mounted component.

6. A monolithic ceramic electronic component according to claim 1, wherein the cross sectional size of the terminal via-hole conductors is smaller than that of the interconnecting via-hole conductors.

7. A monolithic ceramic electronic component according to claim 6, wherein the mounted component is an electronic component having bump electrodes and is joined to the end surfaces of the terminal via-hole conductors through the bump electrodes.

8. A monolithic ceramic electronic component according to claim 7, wherein the mounted component is an electronic component electrically connected by wire bonding and is electrically connected to the end surfaces of the terminal via-hole conductors through bonding wires.

9. A monolithic ceramic electronic component according to claim 1, further comprising a cavity having an opening along the first end surface.

10. A monolithic ceramic electronic component according to claim 1, wherein the terminal via-hole conductor has micropores therein.

11. An electronic device comprising:

a monolithic ceramic electronic component according to claim 1;

an interconnection substrate mounting the monolithic ceramic electronic component, the interconnection substrate facing the first end surface of the composite and electrically connected through the conductor layer which constitutes the first terminal; and a component mounted on the second end surface of the composite, electrically connected through the end surfaces of the terminal via-hole conductors.

* * * * *